United States Patent [19]

Letize et al.

[11] Patent Number: 5,328,561
[45] Date of Patent: Jul. 12, 1994

[54] MICROETCHANT FOR COPPER SURFACES AND PROCESSES FOR USING SAME

[75] Inventors: Raymond A. Letize, West Haven; William J. DeCesare, Wolcott; Lucia Justice, Waterbury, all of Conn.

[73] Assignee: MacDermid Incorporated, Waterbury, Conn.

[21] Appl. No.: 911,407

[22] Filed: Jul. 10, 1992

[51] Int. Cl.⁵ .......................................... H01L 21/00
[52] U.S. Cl. ...................................... 156/666; 156/640; 156/664; 252/79.1; 252/79.5
[58] Field of Search ...................... 252/79.1, 79.5; 156/640, 664, 666, 651, 656, 655

[56] References Cited

U.S. PATENT DOCUMENTS

| | | | |
|---|---|---|---|
| 3,011,920 | 12/1961 | Shipley, Jr. | 117/213 |
| 3,532,518 | 10/1970 | D'Ottavio | 106/1 |
| 4,209,331 | 6/1980 | Kukanskis et al. | 106/1.23 |
| 4,279,948 | 7/1981 | Kukanskis et al. | 427/305 |
| 4,319,955 | 3/1982 | Murski | 156/659.1 |
| 4,409,037 | 10/1983 | Landau | 148/6.14 R |
| 4,515,829 | 5/1985 | Deckert et al. | 427/97 |
| 4,597,988 | 7/1986 | Kukanskis et al. | 427/97 |
| 4,608,275 | 8/1986 | Kukanskis et al. | 427/98 |
| 4,622,344 | 3/1986 | Babcock et al. | 521/28 |
| 4,751,106 | 6/1988 | Wilkinson et al. | 427/98 |
| 4,756,930 | 7/1988 | Kukanskis et al. | 427/97 |
| 4,844,981 | 7/1989 | Landau | 428/413 |
| 4,863,758 | 9/1989 | Rhodenizer | 427/97 |
| 4,976,990 | 12/1990 | Bach et al. | 427/98 |
| 5,032,427 | 7/1991 | Kukanskis et al. | 427/97 |
| 5,104,687 | 4/1992 | Tomaiuolo et al. | 427/98 |

FOREIGN PATENT DOCUMENTS 2136919 2/1972 Fed. Rep. of Germany .

Primary Examiner—R. Bruce Breneman
Assistant Examiner—George Goudreau
Attorney, Agent, or Firm—St. Onge Steward Johnston & Reens

[57] ABSTRACT

An alkaline solution for the microetching of copper in the course of printed circuit manufacture is provided by combining components which are a source of cupric ion, ammonium hydroxide and/or a source of ammonium ion, and a compound, other than ammonia, which is a chelator for cupric ion in the alkaline environment of the solution. The microetchant composition is stable, brings about a desired microroughening of the copper surface with minimal removal of copper, is easily regenerated, and does not promote pink ring. When an organosilane through-hole conditioning agent is included in the composition, the composition can be used as a means for effecting in one step the microetching and conditioning steps of a printed circuit through-hole metallization process.

11 Claims, No Drawings

MICROETCHANT FOR COPPER SURFACES AND PROCESSES FOR USING SAME

BACKGROUND OF THE INVENTION

The present invention relates generally to the fabrication of printed circuits; more particularly to compositions for microetching copper surfaces in the course of fabricating a printed circuit; and still more particularly to printed circuit fabrication processes employing the copper microetching compositions in admixture with through-hole conditioners.

There are a wide variety of techniques employed for fabricating printed circuits, be they single-sided or double-sided circuits, multilayer circuits, rigid or flexible circuits, or the like. In a great many fabrication techniques, a necessary step in the fabrication sequence involves the controlled microetching of a copper surface, generally for purposes of preparing the copper surface for some subsequent step, such as the provision thereon of a coating layer of metal, organic resist or masking material, or the like.

This surface microetching is in distinct contrast to the process of "copper etching" which is common to all subtractive processes for fabricating printed circuits, i.e., wherein the object is the complete removal (etching away) of selected copper areas from the underlying substrate surface. Instead, the general aim of copper microetching is the controlled removal of only a very small amount of copper from the surface (e.g., removal of only about 0.5 to 3 microns thickness from a copper layer of 30–40 microns thickness), and in a manner which results in a remaining exposed copper surface which is topographically altered (e.g., microroughened) as compared to the original copper surface.

By way of brief example, circuitry innerlayers for use in fabricating multilayer printed circuits are typically prepared from a copper foil-clad insulating substrate material (e.g., epoxy, polyimide) which is then patterned, in the positive of the desired circuitry pattern, with an organic etch-resistant material. Copper areas not covered by the resist are then chemically etched away, and the resist then removed to reveal the selective copper circuitry pattern. In assembling a multilayer printed circuit, one or more such circuitry innerlayers are stacked in alternating array with one or more prepreg layers comprised of partially cured resinous material, and the composite then subjected to heat and pressure to cure the resin and provide a multilayer circuit structure in which the innerlayer circuitry layers are firmly bonded to resin layers. In this regard, it is commonplace to form a conversion coating of copper oxide on the copper surfaces of the innerlayer circuits, before the laminating process, to promote adhesion between the innerlayer circuits and cured resins (see, e.g., U.S. Pat. Nos. 4,409,037 and 4,844,981), and it generally is necessary to first microetch the copper surfaces before formation thereon of the copper oxide conversion coating.

Another fabrication sequence in which a copper microetch is employed is in the fabrication of double-sided or multilayer printed circuits having metallized (plated) through-holes. In a multilayer printed circuit, for example, the multilayer composite (whose outer layers are copper foil-clad substrate material) is provided with drilled through-holes and is then subjected to steps for providing the through-hole surfaces with a metal coating, such as by electroless plating. In the course of such plating, metal also is deposited over the copper foil surfaces, and it is commonplace in the process to microetch these foil surfaces (as well as any copper innerlayer surfaces or edges exposed at the through-hole) so that they will more adherently receive the subsequent metal coating.

The foregoing are just a few examples of the many sequences in which there is employed a microetch of a copper surface in the course of fabricating a printed circuit. Other examples include the microetching of copper surfaces to improve adhesion thereto of organic plating or etch resists, microetching of copper surfaces to improve adhesion thereto of other metal deposits (e.g., electrolytic copper, tin-lead etch resists, etc.), microetching of copper surfaces to improve adhesion thereto of solder masks, and the like.

The copper microetchants heretofore employed in the art are acidic compositions, and the most widely employed of these are mixtures of hydrogen peroxide with mineral acids, and mixtures of acids with other strong oxidizers such as the persulfates. While these compositions are effective for achieving the desired controlled microetching of copper surfaces, they are not without disadvantages. One problem is that the compositions are highly unstable, and break down continuously even upon sitting idle. Another problem is that these acidic compositions contribute to the so-called "pink ring" phenomenon when used as copper microetchants in sequences for metallizing through-holes in multilayer printed circuits. As earlier noted, copper oxide conversion coatings are commonly employed as adhesion promoters for the innerlayer circuitry-to-resin bonding needed to provide an integrally bonded multilayer circuit. When through-holes are drilled, the edges of innerlayer circuits are there exposed and the processing chemicals for metallizing the through-holes thus have access to the innerlayer edge areas. The copper oxide adhesion promoter is generally soluble in acid, so acidic processing chemicals for through-hole metallization (such as the acidic copper microetchants) promote localized dissolution of the oxide layer about the periphery of the hole. The dissolution evidences itself as a "pink ring" by virtue of the pink color of the underlying copper metal which is exposed as the copper oxide dissolves therefrom. This localized loss of adhesion promoter (which also can occur at non-hole edge areas of the circuit) can in turn lead to localized delamination in the multilayer circuit, an essentially fatal defect.

While an alkaline copper microetchant would be advantageous in this regard, no such suitable compositions have heretofore been available. Alkaline solutions are known and available for completely etching copper from an underlying substrate surface, as earlier described (also sometimes referred to as "final" etchants or "primary" etchants), such as ammoniacal copper solutions. However, these known solutions in particular, as well as most other known final etchants such as acid-based ferric or copper chloride solutions, are highly unsuitable for copper microetching. In particular, these etchants are extremely difficult to control (i.e., to remove only a very small portion of copper as opposed to a complete removal of all copper); more fundamentally, even to the extent a degree of control can be achieved so as to obtain less than complete removal of copper, the copper surface they produce is undesirably smooth and lacks the microroughened topography essential to the subsequent fabrication steps.

Another drawback of the known acid-based copper microetchants is related to a recent trend in the printed circuit fabrication art towards attempts to reduce the number of separate processing steps needed in the fabrication sequence. In particular, sequences for the metallization of through-holes traditionally require a number of separate steps such as (a) contact of the printed circuit board and hole surfaces with an oxidizing agent to remove resin smear from innerlayer circuitry edges exposed at the hole surfaces and/or to etch resin back from innerlayer edges at hole surfaces and/or to topographically alter the resin surfaces of the holes; (b) contact with a neutralizer to neutralize residual oxidizing species from step (a); (c) contact with a so-called through-hole conditioner which promotes adherence to the through-hole surfaces of subsequently-applied catalyst species; (d) copper microetching; (e) contact with species catalytic to subsequent metal depositing; and (f) contact with a suitable metal depositing solution. Efforts to reduce the number of such steps, by combining together in one composition components which will thus effect in one step two or more of the necessary functions, have included combination of neutralizing and microetching steps, and combination of neutralizing, conditioning and microetching steps. See, e.g., U.S. Pat. No. 4,751,106 and 5,104,687, both incorporated herein by reference.

While the goal of these patents is commendable, the efforts to date are plagued with problems. Specifically, in the aforementioned U.S. Pat. No. 4,751,106, the combination of neutralizing and microetching functions necessarily is constrained to the use of an acidic hydrogen peroxide solution, i.e., the conventional acidic copper microetchant as earlier discussed, which also serves as a neutralizer (reducing agent) for permanganate species utilized in the preceding oxidizing step. In the aforementioned U.S. Pat. No. 5,104,687, the combination of neutralizing, conditioning and microetching steps also is strictly constrained to use of acidic hydrogen peroxide (for neutralizing and microetching), and is further constrained to use of a very specific class of throughhole conditioners, i.e., cationic polyelectrolytes. The requirement for acidic hydrogen peroxide in these processes necessarily brings into play the stability problems and pink ring problems earlier discussed. The further requirement for cationic polyelectrolyte, which according to U.S. Pat. No. 5,104,687 is the only through-hole conditioner compatible with its combined neutralizer-microetchant system, essentially prevents the process from being of any commercial interest, because these conditioners have serious drawbacks in metallization processes per se, and particularly as contemplated in the proposed combination of materials and steps.

As such, the continued reliance in the art upon acidic microetchants for copper in printed circuit fabrication techniques not only requires one to deal with the instability and pink ring problems, but also severely limits possibilities for economizing fabrication techniques through process step reduction.

For the reasons given, a substantial need exists for provision of an alkaline composition suitable as a copper microetchant in this environment.

SUMMARY OF THE INVENTION

It is an object of the present invention to provide an alkaline composition effective for microetching copper surfaces in the course of process sequences for fabricating a printed circuit.

Another object of the invention is to provide printed circuit fabrication sequences which utilize the foregoing copper microetching composition.

Yet another object of the invention is to provide compositions effective both for microetching copper surfaces and for conditioning through-hole surfaces for metallization, and to provide through-hole metallization sequences having a reduced number of processing steps through use of such compositions.

These, and other objects as will be apparent, are achieved through the provision of a copper microetching composition in which there are combined, in aqueous alkaline solution, components comprising a source of cupric ion, ammonium hydroxide and/or a source of ammonium ion, and a copper chelator other than ammonia, in concentrations effective to microetch copper surfaces, typically at a rate not in excess of about 1.2 microns per minute.

The foregoing composition has numerous advantages in the context of the copper microetching which is practiced at one or more stages of printed circuit fabrication, not the least of which are its stability and its alkaline nature. Thus, in contrast to the known acidic microetchants for copper, the composition of the invention has essentially no dissolution effect on typical copper oxide adhesion promoters employed in multilayer printed circuits, and thus does not contribute to pink ring formation and localized delamination.

Yet further, the composition of the invention is a highly effective copper microetchant, in that it brings about a controlled removal of copper in a manner which produces the type of microroughened copper surface necessary for subsequent processing steps (e.g., adhesion to the copper of subsequently-applied metal or organic coatings). Indeed, an important advantage of the composition is that it produces this microroughened topography with only minimal removal of copper. For example, a topography equivalent to that which can only be developed upon removal of 50 microinches (1.2 microns) of copper using the conventional sulfuric acid/hydrogen peroxide microetchant, can be produced upon removal of only 5 microinches (0.12 microns) of copper using the composition of the invention.

Still another significant advantage of the composition of the invention is that it is easily and readily regenerated using either standard electrolysis in simple or bipolar cells, or through pH adjustment to relatively neutral range, precipitation and removal of copper hydroxide, and readjustment of pH back to the operating alkaline range.

A particularly important advantage of the composition of the invention is its compatibility, and combinability, with other compounds finding use in sequences for fabricating printed circuits, thereby enabling a reduction in the processing steps required in such sequences. One example of this advantage is in the inclusion in the microetchant composition of any of a wide variety of surfactants effective to clean copper surfaces of soils, oils, fingerprints, etc. As is well known, alkaline cleaning solutions are far more effective than acidic cleaners in this regard; by providing a microetchant for copper which is alkaline, the invention in turn, then, provides a highly suitable vehicle for inclusion of effective cleaners so as to arrive at a composition excellently functional for both microetching and cleaning. Since a cleaning step often is required in those printed circuit fabrication sequences which include a microetching step, it becomes possible then to eliminate such cleaning as a distinct step.

Of most significant advantage in this regard is the ability to combine the alkaline copper microetchant of the invention with an organosilane through-hole conditioner. The organosilanes have outstanding properties and advantages when employed as conditioners in sequences for metallizing through-holes, as set forth in U.S. Pat. No. 4,976,990, incorporated herein by reference. As also taught in that patent, however, these organosilanes function most effectively when employed in at least slightly alkaline solution. As such, it has not heretofore been possible to combine these through-hole conditioners with microetchants for copper as a means for reducing processing steps, inasmuch as the microetchants known and used in through-hole metallization sequences are acid-based. By providing an effective alkaline copper microetchant, the present invention enables its combination per se with these organosilane conditioners, with the further surprising result that the components of the microetchant do not interfere with, nor detract from, the function of the organosilanes as conditioners, and vice-versa. As such, the invention provides through-hole metallization sequences in which the required copper microetching and through-hole conditioning are combined into a single step; in contrast to other efforts towards this end, the invention provides this step reduction while using the most beneficial means for achieving both functions, i.e., without being constrained to use of acidic microetchants or inferior conditioners.

Still further in these regards, the microetchant composition is such that it can be used to combine functions, in a single composition for use in a single step, of copper microetching, cleaning and through-hole conditioning.

DETAILED DESCRIPTION OF THE INVENTION

The essential components for providing the copper microetchant composition of the invention are a source of cupric ion; ammonium hydroxide and/or a source of ammonium ion; and a copper chelator other than ammonia, all in an aqueous alkaline solution.

The essential reaction mechanism for the microetching of copper metal using this composition is one of disproportionation, i.e.,

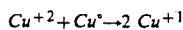

$Cu^{+2} + Cu^° \rightarrow 2\ Cu^{+1}$

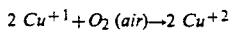

$2\ Cu^{+1} + O_2\ (air) \rightarrow 2\ Cu^{+2}$ in which the bulk of the cupric ion is in complex with the copper chelator other than ammonia, e.g., a copper chelator such as monoethanolamine or the like.

The source of cupric ion can be chosen from any suitable solution-soluble source thereof, with cupric chloride and/or cupric sulfate being preferred. On make-up, the solution typically will contain cupric ion in a concentration of from about 1 to about 60 g/l, more preferably from about 2 to about 40 g/l, and most preferably from about 5 to about 30 g/l.

Ammonium ion and/or ammonium hydroxide provided in the composition serves as a chelator for cuprous ion, whereby the copper etch rate is accelerated, and also may be employed to achieve the requisite alkaline pH of the composition. Where a source of ammonium ion is employed, the source can be chosen from any suitable solution-soluble source, such as ammonium chloride, ammonium sulfate or the like. Ammonium hydroxide may be used in place of, or more preferably in addition to, the source of ammonium ion; it is recited here as a component different from a source of ammonium ion per se due to its weakly basic nature, whereby it may not provide ammonium ion per se in the solution compositions of the invention. The concentration of ammonium ion and/or ammonium hydroxide on make-up typically will be on the order of from about 1 to about 40 g/l, more preferably from about 1 to about 5 g/l, and most preferably from about 2 to about 4 g/l.

The non-ammonia chelator for cupric ion (i.e., a chelator other than ammonia) can be chosen from any suitable solution-soluble compound, and typically will be an amine compound, whether nonionic or ionic, such as ethanolamine, diethanolamine, triethanolamine, ethylenediamine tetraacetic acid, hydroxyethyl ethylenediamine triacetic acid, salts thereof where applicable (including, e.g., ammonium salts of EDTA), Rochelle salts, and the like, and mixtures thereof. Suitable make-up concentrations for this non-ammonia chelator will be on the order of from about 5 to about 115 g/l, more preferably from about 10 to about 30 g/l, and most preferably from about 15 to about 20 g/l.

The microetchant composition may of course contain additional components, whether as pH adjusting agents, buffers or the like, so long as no adverse effect on the essential microetching function per se is realized. As earlier noted, particular embodiments of the invention will involve inclusion in the composition of cleaners and/or organosilane through-hole conditioners.

The pH of the composition on make-up typically will be in the range of from about 8.5 to about 9.5, and more typically in the range of from about 9.0 to about 9.2.

The microetchant composition typically will be employed at a temperature in the range of from about 85° F. to about 130° F., more preferably from about 100° F. to about 120° F., and in an immersion technique in which the printed circuit material, containing the copper surfaces to be microetched, is immersed in a suitable vessel containing the microetchant. Spray operation also is possible, however. The contact time between the copper surfaces and the microetchant solution will vary according to the extent of microetching desired, but typically will be in the range of from about 1 to about 10 minutes, more typically from about 4 to about 6 minutes.

The formulation of the microetchant composition is such that it effects the microetching in a controlled manner, i.e., at a rate which is not so rapid, and in a manner which is not so aggressive, as to undesirably remove too substantial an amount of copper and/or as to undesirably produce a copper surface which is insufficiently microroughened, a situation which often occurs using aggressive etchants. Most desirably, the composition is formulated so as to achieve a rate of etching which is no greater than about 1.2 microns/minute, and moreover which is effective to develop on the copper surface the desired microroughened topography after removal of only about 0.125 microns of copper.

As has previously been noted, the alkaline microetchant composition of this invention is effective for use in all printed circuit fabrication sequences in which the microetching of copper surfaces (used herein to refer also to copper alloys or intermetallics), be they copper foil or electroless copper or electrolytic copper, is a required process, whether in preparation of the copper surface for a subsequently applied metal or organic coating or for any other purpose.

An especially important use of the microetchant composition is as part of a process for the metallizing of through-holes in double-sided or multilayer printed circuits. In these circuits, through-holes with metallized surfaces are the means by which conductive interconnection of circuitry layers, otherwise separated by dielectric material, is obtained, and also serve as sites for provision of the circuit with electronic components.

In a typical sequence for providing metallized through-holes in a multilayer printed circuit, numerous holes are drilled or punched at specified locations through the multilayer composite. The hole surfaces are then contacted with an oxidizing agent in a step generally referred to in the art as "desmearing" owing to the fact that a primary object is to remove, from innerlayer circuitry edges exposed at the hole locations, resin which has smeared or deposited thereon due to the hole-forming process. Within the ambit of this desmearing step are also processes in which the function of the oxidizing agent is to etch the resinous surfaces of the hole back away from the innerlayer edges so as to expose more of the edges, and/or to topographically alter the resinous surfaces of the hole so as to make them more receptive to receipt of metal coating. Typically, this desmearing step per se includes contact of the hole surfaces with an organic solvent prior to the oxidizing agent.

For further details regarding this step of the through-hole metallization process, reference may be had, e.g., to U.S. Pat. Nos. 4,515,829; 4,597,988; 4,756,930; and 5,032,427, all incorporated herein by reference.

The next major step in the hole metallization process is the so-called "neutralizing" step. In the desmearing step, the oxidizing agents typically are permanganate solutions, chromic acid, or the like, and it is necessary to remove any residues of these species from the hole surfaces before subsequent steps are carried out. Most typically, the neutralizing step will employ reducing agents for the oxidizing species in question, such as the use of hydrazine or the hydroxylamines for neutralizing residual manganese residues, all as discussed in the aforementioned patents.

In the next step of the hole metallization process, known as "conditioning", the hole surfaces are contacted with solutions which deposit thereon a through-hole conditioner which serves to make the hole surfaces more receptive to adherent receipt of either the subsequent metal deposit and/or catalytic species employed prior to the actual metal deposit. Traditional through-hole conditioners are film-forming surfactants, but the most advantageous conditioners are the organosilanes, as discussed in the earlier-referred to U.S. Pat. No. 4,976,990.

The next step in the process is copper microetching, already extensively discussed, although in situations where organosilanes are employed it is possible to carry out the microetching prior to the conditioning step. In any event, it is at this stage in a traditional hole metallization sequence that the alkaline microetchant composition of the invention will be employed to achieve the requisite microetching of the copper surfaces, with all the advantages earlier described.

The subsequent steps of the hole metallization sequence may vary depending upon the nature of the metal deposit to be provided. Typically, however, the metallization will be by way of electroless copper deposition, and thus the next step in the sequence is to provide the hole surfaces (as well as all other exposed copper surfaces) with the catalytic species which promote electroless copper deposition. The catalytic materials most commonly employed are based upon palladium, and are applied as true or colloidal solutions of tin and palladium salts, sometimes followed by a so-called acceleration step. See, e.g., U.S. Pat. Nos. 3,011,920; 3,532,518; 4,608,275; and 4,863,758, all incorporated herein by reference. Following this catalysis, the catalyzed surfaces are electrolessly copper plated using an electroless copper plating bath, which may be of the formaldehyde-reduced variety or based on other reducing agents such as hypophosphite (see, e.g., U.S. Pat. Nos. 4,209,331 and 4,279,948).

As has been noted, there have been efforts in the art to reduce the number of separate steps required in this hole metallization sequence, by combining together agents which in one step can effectuate multiple required functions. The provision in this invention of an effective alkaline microetchant for copper greatly enhances the ability to achieve this step reduction in a manner consistent with the stringent requirements for metallized through-holes.

In particular, the provision of an alkaline microetchant for copper enables the combining with it of the organosilane through-hole conditioning agents of U.S. Pat. No. 4,976,990, whereas heretofore any hole metallization sequence seeking to make use of these highly advantageous conditioners necessarily had to provide for separate microetching and conditioning steps (and with water rinses therebetween) owing to the incompatability between acid-based microetchants and organosilane conditioners. According to this aspect of the invention, then, the earlier-described alkaline microetchant composition is formulated so as to further comprise one or more of the organosilane conditioners, typically at concentrations of from about 0.5 to 30 g/l, and at a composition pH in the range of from about 7.5 to about 11. This composition is then employed in contact with the through-hole-containing printed circuit material, and is found effective to bring about simultaneous microetching and through-hole conditioning, and indeed without any substantial difference in microetching or conditioning as found in making separate use of the microetchant and the organosilane conditioner. The contact time and conditions earlier set forth for microetching with the microetchant composition per se are also suitable for bringing about microetching and conditioning using the microetchant composition containing organosilane.

Also as previously noted, the alkaline nature of the microetchant composition herein readily enables combination with it of a wide variety alkaline-compatible cleaners (surface active agents, detergents) to effectuate copper surface cleaning steps often required in hole metallization and other printed circuit fabrication sequences, and which heretofore have required either a separate step per se in order to use alkaline solutions of cleaners, or use of acid-compatible cleaners when sought to be combined with any other acid-based solutions used in the process. These cleaners can be included in the microetchant composition, or the microetchant/conditioner composition, at any suitable levels, and typically in the range of from about 1 to about 30 g/l.

The invention is further illustrated with reference to the following examples.

EXAMPLE I

An aqueous solution was prepared containing 20 g/l cupric sulfate pentahydrate, 15 g/l monoethanolamine, 10 g/l ammonium sulfate, 2.0 g/l ammonium hydroxide, 0.15 g/l nonionic surfactant and 5.0 g/l of the organosilane of Example 1 of U.S. Pat. No. 4,976,990.

This composition was employed at 100° F. and a range of immersion times to microetch the copper surfaces of an epoxy-glass substrate clad with copper foil (approximately 36 microns in thickness), with the following results:

| Immersion Time (Min.) | Copper Removed (Microns) |
|---|---|
| 1 | 0.15 |
| 2 | 0.35 |
| 5 | 0.75 |
| 8 | 1.25 |
| 10 | 1.80 |

Scanning electron microscope analysis of the copper surface after a 10-minute immersion time evidenced an excellent microroughened topography.

The same composition was employed in a throughhole metallization process in which a multilayer printed circuit material, whose outer-facing surfaces consisted of copper foil, was provided with drilled through-holes; desmeared using a sequence of immersion in an epoxy solvent at 90° F. for 2 minutes, followed by water rinsing, immersion in alkaline permanganate at 160° F. for 5 minutes, followed by water rinsing; neutralized by immersion in hydroxylamine at 90° F. for 3 minutes followed by rinsing; immersed in contact with the above composition at 100° F. for 5 minutes followed by rinsing; catalyzed using a sequence of activator pre-dip at room temperature for one minute, immersion in palladium/tin colloid activator at 80° F. for 5 minutes, water rinse, acceleration via an oxidizing accelerator (see U.S. Pat. No. 4,608,275), and water rinsing; and then electrolessly copper plated. Sectioning of through-holes and analysis by standard back-light test revealed that excellent conditioning had occurred (complete coverage of hole surfaces with adherent electroless copper), and no evidence was seen of any copper-to-copper adhesion problems. Copper to resin and copper-to-glass adhesion at the throughholes also were excellent. These same results were found after electroplating of copper over the electroless copper deposit and in subsequent solder shock testing.

EXAMPLE II

The foregoing composition of Example I was modified by varying the concentration of cupric sulfate pentahydrate therein. The various compositions were then employed to microetch copper foil surfaces at 100° F. and 5 minutes immersion time, with the following results:

| CuSO4.5H2O (g/l) | Copper Removed Microns) |
|---|---|
| 20 | 0.5 |
| 40 | 0.8 |
| 80 | 1.5 |
| 100 | 1.9 |

These various compositions also were utilized in throughhole metallization sequences as in Example I, with similar results as there described.

EXAMPLE III

An aqueous solution containing 20 g/l cupric sulfate pentahydrate, 15 g/l monoethanolamine, 10 g/l ammonium sulfate and 2 g/l ammonium hydroxide was employed, at 100° F. and an immersion time of one minute, to microetch a copper panel prior to electroplating of copper thereon. Copper removal was approximately 0.15 microns, and the microroughened surface so produced was highly acceptable. Copper-to-copper adhesion after electroplating was excellent.

As noted earlier, a significant advantage of the composition of this invention is its ability to be rapidly and efficiently regenerated when it has become over-laden with etched copper. One simple means for regeneration involves standard electrolysis of the solution in either a simple or bipolar cell, utilizing insoluble anodes, whereby copper values are recovered as copper metal (e.g., sheets) on the cathode. Another regeneration technique is to adjust the solution pH with suitable acid addition to a near neutral pH range (e.g., 5.5–7.0), whereby copper built up in the solution precipitates as an appropriate salt (e.g., copper hydroxide) which can be filtered off. The remaining supernatant, which will retain a necessary low level of copper as well as the other necessary components of the microetchant composition, is then readjusted back to operating alkaline pH (e.g., with ammonium hydroxide) for further use.

Although the invention has been described herein with reference to particular preferred embodiments and examples, it should be understood that these are not to be considered limiting of the scope of the invention except to the extent expressly set forth in the appended claims.

What is claimed is:

1. A process for microetching a copper surface to remove copper therefrom and produce a remaining copper surface which is microroughened, comprising contacting said copper surface with a composition comprising the combination, in an aqueous solution, of components comprising a source of cupric ion, ammonium hydroxide and/or a source of ammonium ion, and a chelator for cupric ion other than ammonia selected from the group consisting of monoethanolamine, ehtylenediamine tetraacetic acid, salts of ethylenediamine tetraacetic acid, and mixtures thereof, said contacting beign at a composition temperature of from 85° F. to 130° F., and for a time, and at conditions, effective to achieve such microroughening.

2. A process according to claim 1 wherein, in said composition, the concentration of said cupric ion is from 1 g/l to 60 g/l; the concentration of said ammonium ion and/or ammonium hydroxide in said solution is from 1 g/l to 40 g/l; and the concentration of said chelator other than ammonia in said solution is from 5 g/l to 115 g/l.

3. A process according to claim 2 wherein, in said composition, said chelator other than ammonia is monoethylanolamine.

4. A process according to claim 1 wherein said composition microetches copper at a rate not in excess of 1.2 microns per minute.

5. A process according to claim 1 wherein said composition further comprises an organosilane.

6. A process according to claim 5 wherein, in said composition, the concentration of said organosilane is from 0.5 to 30 g/l.

7. A process according to claim 1 wherein said composition further comprises an alkaline compatible surfactant cleaner.

8. A process according to claim 7 wherein said cleaner is present in said composition at a concentration of 1 g/l to 30 g/l.

9. In a process for providing the surfaces of through-holes with a metal coating incident to the fabrication of a printed circuit, wherein a printed circuit material containing through-holes is subjected to steps of microetching, conditioning and metal coating, the improvement comprising effecting said microetching and said conditioning in a single processing step employing an aqueous alkaline solution which comprises a source of cupric ion, ammonium hydroxide and/or a source of ammonium ion, a chelator for cupric ion other than ammonia, and an organosilane through-hole conditioner.

10. A process according to claim 9 wherein said composition further comprises an alkaline compatible surfactant cleaner.

11. A process according to claim 10 wherein said cleaner is present in said composition at a concentration of 1 g/l to 30 g/l.

* * * * *